(12) United States Patent
Chann et al.

(10) Patent No.: US 9,268,142 B2
(45) Date of Patent: *Feb. 23, 2016

(54) OPTICAL CROSS-COUPLING MITIGATION SYSTEM FOR MULTI-WAVELENGTH BEAM COMBINING SYSTEMS

(71) Applicants: Bien Chann, Merrimack, NH (US); Robin Huang, North Billerica, MA (US); Parviz Tayebati, Sherborn, MA (US)

(72) Inventors: Bien Chann, Merrimack, NH (US); Robin Huang, North Billerica, MA (US); Parviz Tayebati, Sherborn, MA (US)

(73) Assignee: TeraDiode, Inc., Wilmington, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/746,951

(22) Filed: Jun. 23, 2015

(65) Prior Publication Data

US 2015/0286058 A1 Oct. 8, 2015

Related U.S. Application Data

(63) Continuation of application No. 13/841,821, filed on Mar. 15, 2013, which is a continuation-in-part of application No. 13/218,251, filed on Aug. 25, 2011, now Pat. No. 8,488,245, which is a (Continued)

(51) Int. Cl.
| | |
|---|---|
| G02B 27/10 | (2006.01) |
| H01S 3/00 | (2006.01) |
| H01S 3/08 | (2006.01) |
| G03B 21/26 | (2006.01) |
| G02B 5/18 | (2006.01) |

(52) U.S. Cl.
CPC .............. G02B 27/1006 (2013.01); G02B 5/18 (2013.01)

(58) Field of Classification Search
CPC .......... G02B 27/08; G02B 26/00; G02B 3/00; G02B 27/10; G02B 27/14; G02B 27/12; G02B 5/04; G02F 1/29; G02F 1/03; G02F 1/01; G02F 1/33; G02F 1/11
USPC ......... 359/618, 299, 624, 245, 241, 244, 288, 359/305, 285, 308, 311–312, 290–292, 872, 359/263, 223–224, 318, 649, 846, 129, 496, 359/631, 629, 634, 636, 638–640, 831, 359/833–834, 630, 341.3, 341.33, 337.21; 353/31, 34, 81; 451/28, 41; 372/25, 92, 372/98, 102

See application file for complete search history.

(56) References Cited

U.S. PATENT DOCUMENTS

| | | |
|---|---|---|
| 6,044,096 A | 3/2000 | Wolak et al. |
| 6,192,062 B1 | 2/2001 | Sanchez-Rubio et al. |

(Continued)

FOREIGN PATENT DOCUMENTS

| | | |
|---|---|---|
| JP | 2007-165624 A | 6/2007 |
| WO | 02/091077 A1 | 11/2002 |

(Continued)

OTHER PUBLICATIONS

Chann et al., "Efficient, High-Brightness Wavelength-Beam-Combined Commercial off-the-Shelf Diode Stacks Achieved by use of a Wavelength-Chirped Volume Bragg Grating", Optics Letters, vol. 31, No. 9, May 1, 2006, pp. 1253-1255.

(Continued)

*Primary Examiner* — Dawayne A Pinkney
(74) *Attorney, Agent, or Firm* — Morgan, Lewis & Bockius LLP

(57) ABSTRACT

A system and method for increasing efficiency and power output of a multi-wavelength beam combining system through providing a common output coupler to reflect feedback that stabilizes or individually seeds each emitter, and wherein the individual feedback is preserved by mitigating cross-coupling, wherein a multi-wavelength beam comprised of radiation having a plurality of wavelengths, high brightness and power.

14 Claims, 4 Drawing Sheets

Related U.S. Application Data continuation-in-part of application No. 13/042,042, filed on Mar. 7, 2011, now Pat. No. 8,553,327.

(60) Provisional application No. 61/376,900, filed on Aug. 25, 2010, provisional application No. 61/310,777, filed on Mar. 5, 2010, provisional application No. 61/310,781, filed on Mar. 5, 2010, provisional application No. 61/417,394, filed on Nov. 26, 2010.

(56) References Cited

U.S. PATENT DOCUMENTS

| | | |
|---|---|---|
| 6,356,576 B1 | 3/2002 | Smith |
| 8,049,966 B2 | 11/2011 | Chann et al. |
| 2002/0071627 A1 | 6/2002 | Smith et al. |
| 2004/0095983 A1 | 5/2004 | Whitley |
| 2006/0109876 A1 | 5/2006 | Donoghue et al. |
| 2007/0002925 A1 | 1/2007 | Zediker et al. |
| 2010/0110556 A1 | 5/2010 | Chann et al. |
| 2013/0208361 A1 | 8/2013 | Chann et al. |

FOREIGN PATENT DOCUMENTS

| | | |
|---|---|---|
| WO | 2006/045303 A2 | 5/2006 |
| WO | 2006/097531 A1 | 9/2006 |

OTHER PUBLICATIONS

Chann et al., "High-Power Near-Diffraction-Limited Wavelength-Beam-Combined Diode Arrays", Conference on Lasers & Electro-Optics (CLEO), vol. 1, May 27, 2005, pp. 429-431.

Chann et al., "Near-Diffraction-Limited Diode Laser Arrays by Wavelength Beam Combining", Optics Letters, vol. 30, No. 16, Aug. 15, 2005, pp. 2104-2106.

OPTICAL CROSS-COUPLING MITIGATION SYSTEM FOR MULTI-WAVELENGTH BEAM COMBINING SYSTEMS

CROSS-REFERENCE TO RELATED APPLICATIONS

This application is a continuation of U.S. patent application Ser. No. 13/841,821, filed on Mar. 15, 2013, which is a continuation-in-part of U.S. patent application Ser. No. 13/218,251, filed on Aug. 21, 2011, which (i) claims the benefit of and priority to U.S. Provisional Patent Application No. 61/376,900, filed on Aug. 25, 2010, and (ii) is a continuation-in-part of U.S. patent application Ser. No. 13/042,042, filed on Mar. 7, 2011, which claims the benefit of and priority to U.S. Provisional Patent Application No. 61/310,777, filed on Mar. 5, 2010, U.S. Provisional Patent Application No. 61/310,781, filed on Mar. 5, 2010, and U.S. Provisional Patent Application No. 61/417,394, filed on Nov. 26, 2010. The entire disclosure of each of these applications is hereby incorporated herein by reference.

BACKGROUND OF THE INVENTION

1. Field of the Invention

The present embodiments relate generally to laser systems and more particularly to wavelength beam combining systems and methods.

2. Description of the Prior Art

Wavelength beam combining (WBC) is a method for scaling the output power and brightness from laser diode bars, stacks of diode bars, as well as other lasers arranged in one or two-dimensional array.

WBC methods have been developed to combine beams along the slow dimension of each emitter as well as the fast dimension of each emitter. See for example, U.S. Pat Nos. 6,192,062, 6,208,679 and 2010/0110556 A1. In prior patents, U.S. Pat. Nos. 6,192,062 and 6,208,679, beam combining is performed along the array dimension. As such, the external cavity is more sensitive to imperfections in the laser elements. Furthermore, when broad-area laser elements are used the spectral utilization is poor. In prior art 2010/0110556 A1 beam combining is performed along the stacking dimension. In such implementations the external-cavity is much less sensitive to imperfections in laser elements. Furthermore, since beam combining is performed along the stacking dimension or near diffraction-limited dimension spectral utilization is high. However, the brightness of these systems may not be optimal because of optical cross-coupling between emitters.

The following application seeks to solve the problems stated.

SUMMARY OF THE INVENTION

A wavelength beam combining system comprising a plurality of emitters, such as diode elements, are combined using a dispersive element to form a multi-wavelength beam. Each emitter in the system individually resonates, and is stabilized through wavelength specific feedback from a common partially reflecting output coupler that is filtered by the dispersive element along a beam combining dimension, and wherein any cross-talk between feedback beams is mitigated using a non-slit cross-coupling mitigating optical system. In one embodiment this system comprises first and second optical elements wherein the focal length of the first element is substantially greater than the focal length of the second element. The cross-coupling mitigation system is aligned such that the first optical element is positioned within the Rayleigh range of a multi-wavelength beam transmitted by the dispersive element, while the output coupler is in the Rayleigh range of the multi-wavelength beam transmitted by the second element of the optical system. Thus, producing a high brightness, power, and efficient multi-wavelength beam combining system.

DETAILED DESCRIPTION OF THE PREFERRED EMBODIMENT

Figure 1A:
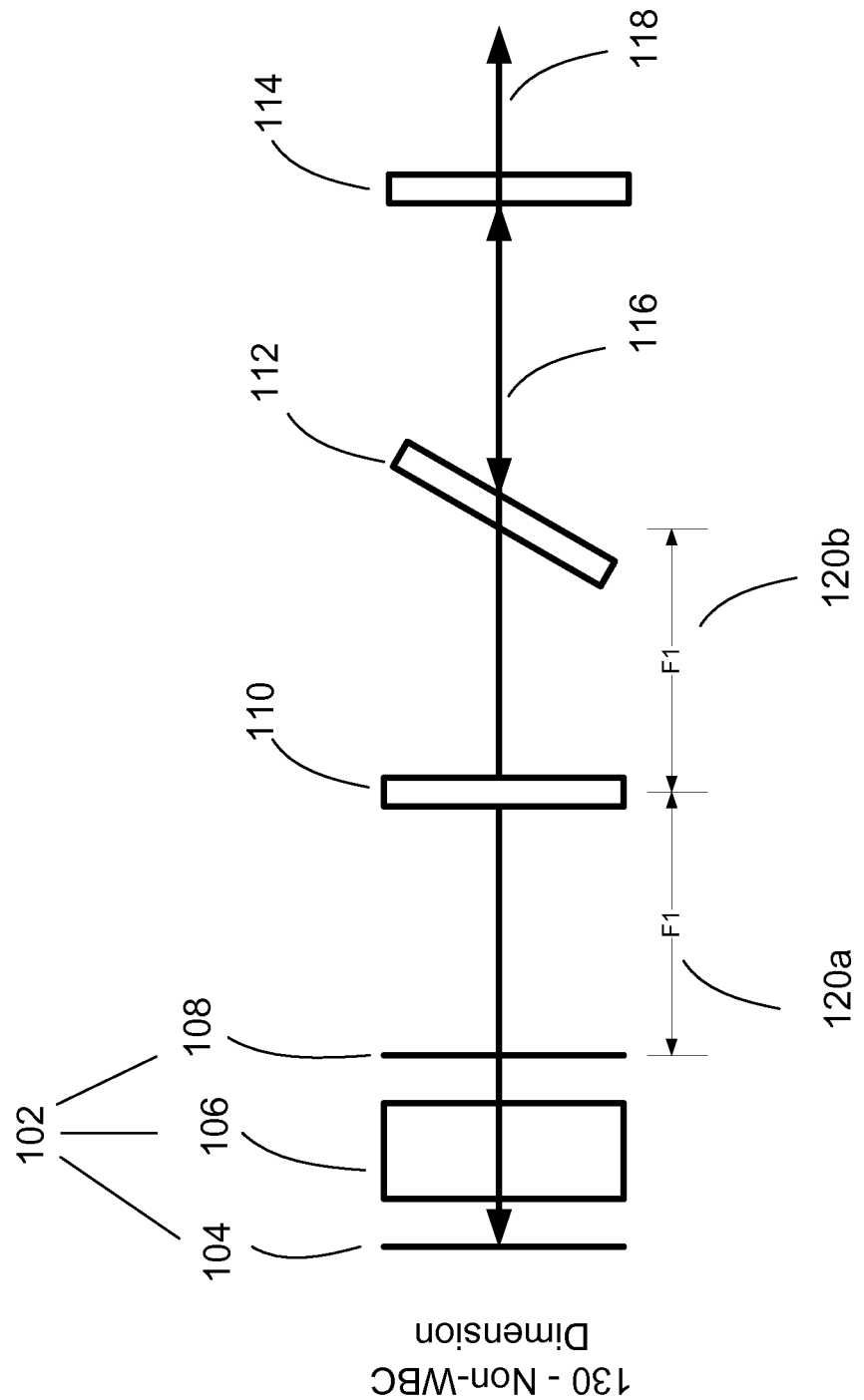
FIGS. 1A-B illustrate the beam combining and non beam combining schematics of previous WBC systems.

Aspects and embodiments relate generally to the field of scaling laser sources to high-power and high-brightness using wavelength beam combining techniques. More particularly, methods for increasing brightness, stability, and effectiveness of wavelength beam combining systems.

Embodiments described herein address mitigating the amount of unintended/undesired feedback from non-originated emitters. For example, two emitters in a WBC system sharing a common partially-reflective mirror, have the potential to cause feedback from one emitter to enter the second emitter. This undesirable feedback from a non-originated emitter reduces the efficiency of the system. Other terms used in the art are cross-talk or cross-coupling, which these embodiments seek to mitigate or eliminate thereby increasing brightness and efficiency of a wavelength beam combining laser system.

The approaches and embodiments described herein may apply to one and two-dimensional beam combining systems along the slow-diverging, fast-diverging, or other beam combining dimension.

For purposes of this application, optical elements may refer to any of lenses, mirrors, prisms and the like which redirect, reflect, bend, or in any other manner optically manipulate electromagnetic radiation. Additionally, the term beam includes visible light, infrared radiation, ultra-violet radiation, and electromagnetic radiation. Emitters include any beam-generating device such as semiconductor elements, which generate a beam, but may or may not be self-resonating. These also include fiber lasers, disk lasers, non-solid state lasers and so forth. Generally each emitter is comprised of at least one gain element. For example, a diode element is configured to produce a beam and has a gain element, which may be incorporated into a resonating system.

It should also be understand that certain emitters mentioned in embodiments below, such as a diode element, may be interchanged with other types of beam emitters.

Also for purposes of this application, often times emission beams used have profiles where one dimension is close to or is diffraction limited, while the other dimension is many times diffraction limited. Another way of describing this may be in terms axis and/or dimension. For example, an output beam may have a slow and a fast diverging axis or dimension.

When using the term substantially greater, when referring to the focal length of one optical element as compared to the focal length of another optical element (f1>>f2), it is to be understood that to be a factor of at least 2, 3, 4, 5, 7 times or greater. E.g. the focal length of f1 is 100 mm while the focal length of f2 is 50 mm. In another embodiment the focal length of f1 is 200 mm while f2 is 20 mm.

Angular filter refers to a plurality of optical elements that create a specified numerical aperture for feedback beams. The size of this numerical aperture created may limit the allowed feedback to only the originally emitted beam. Vice versa the angular filter prevents adjacent or nearby emitted beams from returning (cross-talk) into the original emitter.

Stabilization of emitters refers to feedback received by each emitter that has been narrowed to a distinct wavelength. This may be in the form of seeding the emitters with a particular wavelength, causing a portion of the emitted beam to be redirected back into the emitter, and intervening with the feedback, such as placing an optical grating in the way, to produce a distinct wavelength to be directed into the emitters as feedback. Often times feedback is reflected back towards the original emission area, where it passes through a dispersive element or diffraction grating prior to entering back into the optical gain medium portion of the original emitter.

In some WBC embodiments, the feedback source may be a common reflective surface that provides feedback to a plurality of emitters, with each of the feedback beams being individually tuned to a particular wavelength.

Figure 1B:
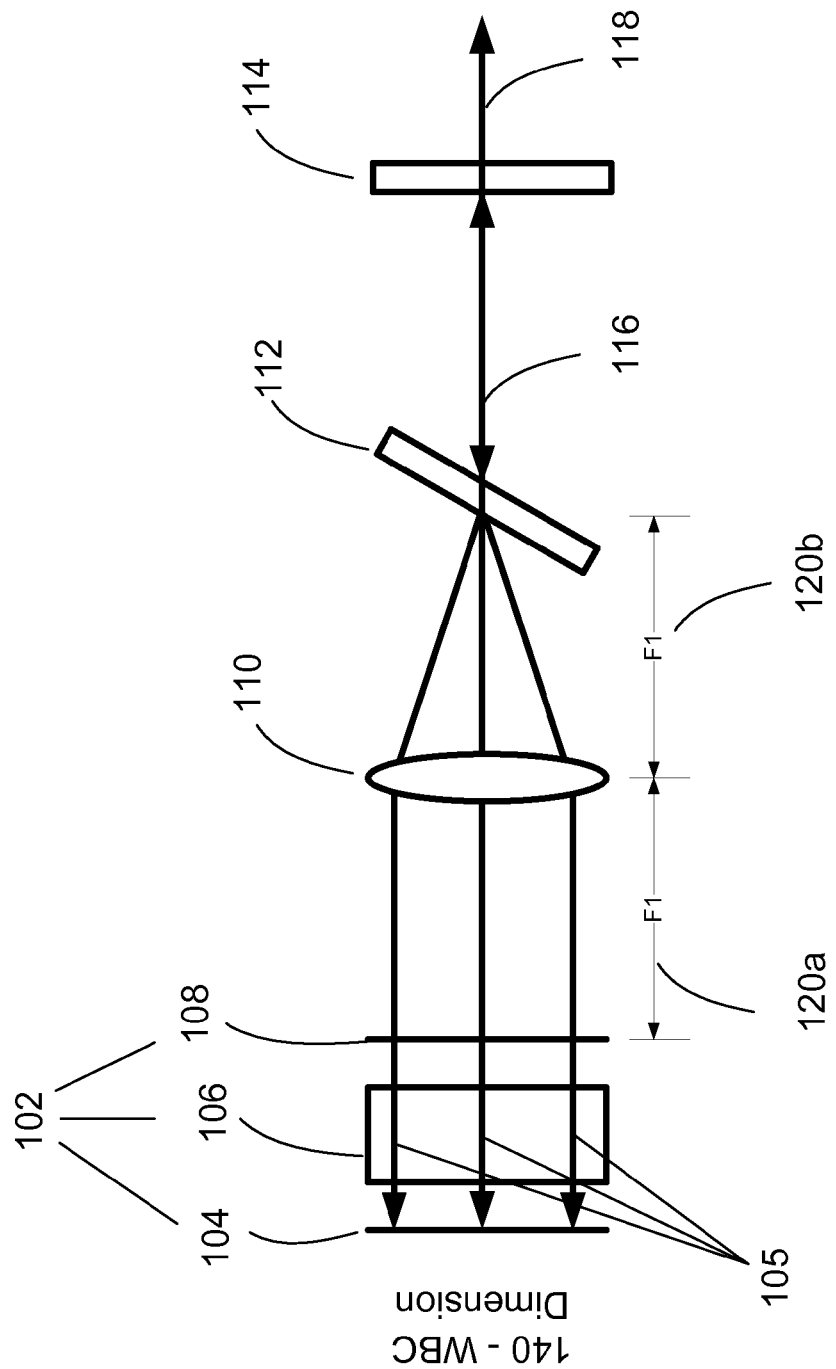

FIGS. 1A-B illustrate an external-cavity one-dimensional (1-D) wavelength beam combining system consisting of a one-dimensional diode bar 102 having a back reflective surface 104, a gain medium 106 with two or more diode emitters 105, a front reflective surface 108, a combining optic 110, a dispersive element 112, and a partially reflecting output coupler 114. In this embodiment, the combining optic or lens 110 is placed a focal distance 120a away from the front reflective surface 108 of the diode bar 102 while on the back plane or other side of lens 110, dispersive element 112 is placed a focal distance 120b away. The output coupler 114 is placed at a certain distance from the dispersive element 112 and reflects a portion of the generated beams (feedback 116) back towards dispersive element 112.

In this embodiment, the placement of the combining lens 110 is done to accomplish two functions: The first function is to overlap all the chief rays from all the diode elements onto the dispersive element 112. The second function is to collimate each beam in both axes. See FIGS. 1A-B for a schematic view of the non-beam combining dimension 130 view (FIG. 1A) and the beam combining dimension 140 view (FIG. 1B). Diode bar 102 is comprised of a plurality of emitters (diode emitters) 105, a back reflecting surface 104, gain medium 106, and a front surface/facet 108.

Cross-Coupling Optical Management System

Figure 2:
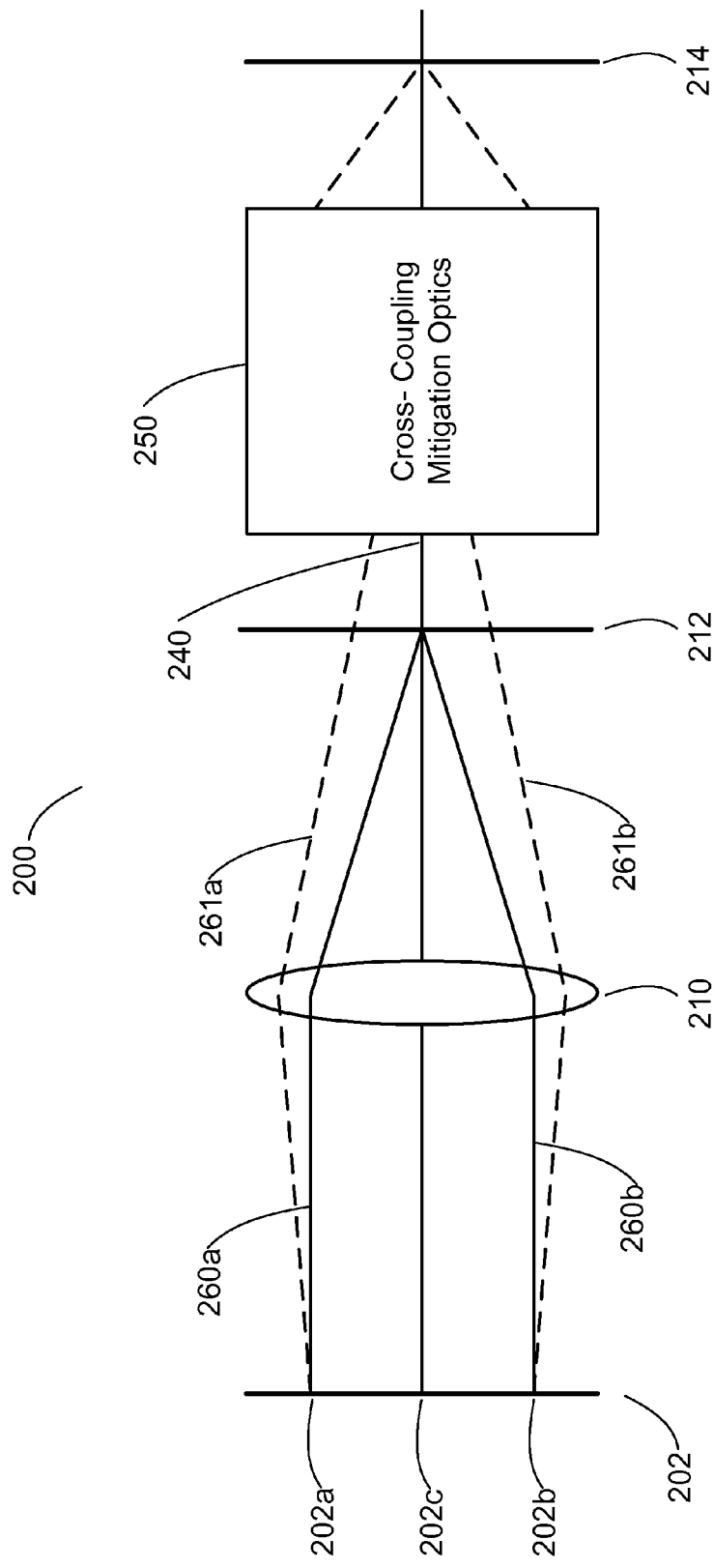
FIG. 2 illustrates a schematic of a cross-coupling optical management system incorporated into a WBC system.

In WBC resonators it is possible for adjoining emitters to optically cross-couple with each other. This may seriously degrade the output beam quality. FIG. 2 is schematic of a WBC resonator, with two adjoining emitters 202a and 202b sending their nominal on-axis chief rays 260a and 260b shown as solid lines going to lens 210, which focuses them onto the center of the grating 212. From there, both chief rays are diffracted at their own unique wavelengths to propagate along the same axis 240, through the cross-coupling mitigation optics 250 that represents any and all lenses or optical elements between the grating 212 and the partially-reflective coupler 214. Both rays are then partially reflected back onto themselves, propagating backwards to self-couple into their respective emitters. The dashed lines 261a and 261b in FIG. 2 show the chief rays that would result in optical cross-coupling between the two emitters—i.e. a chief ray emanating from one emitter couples back into another emitter.

The following parameters are defined as such:
d=distance between the two emitters (symmetrically displaced above and below the axis by +/−(d/2)).
ε=deviation angle (the angle between the solid-line chief rays and the dotted-line chief rays at the emitters.
$\theta_{1/2}$=semi-divergence far-field angle of an emitter in the WBC direction.
$L_0$=distance from the emitters to lens L1.
$f_1$=focal length of lens L1.

In FIG. 2, the grating is shown as if it worked at normal incidence. Here, it is assumed that we are operating in the Littrow configuration, where the incident angle and the diffracted angle are equal (and non-zero). In the Littrow configuration, a small change in the incident angle is matched to first order by an equal change in the diffracted angle. In our unfolded schematic, then, any ray operating at Littrow would appear to propagate straight through the grating. It is clear that only the center ray 202c (the one that would emanate from an imaginary emitter halfway between two emitters 202a and 202b) self-couples at Littrow.

The symmetry in FIG. 2 is deliberate, as it allows for couple of important simplifications in the analysis of the unique deviation angle ε at which a chief ray could exit one emitter and return to the other. The first symmetry-based simplification is that the deviated (dashed-line) chief ray must hit the coupler at its center. The second simplification is that the cross-coupling wavelength must be the average of the two self-coupling wavelengths. This would in turn be the wavelength of an imaginary emitter halfway between our two emitters, which we noted above would self-couple at Littrow. Therefore, the dashed-line chief rays in FIG. 2 must traverse the grating at Littrow, meaning that they would appear to propagate straight through the grating as shown in our cartoon. Using this simplification, we can use a conventional "y/y-bar" (chief ray height/chief ray slope) analysis to trace the top dashed-line chief ray:

Leaving the top emitter:

$$y_{emitter} = \frac{d}{2} \quad (1)$$

$$\bar{y}_{emitter} = \varepsilon \quad (2)$$

Entering lens L1:

$$y_{L1\_in} = y_{emitter} + L_0 \bar{y}_{emitter} = \frac{d}{2} + L_0 \varepsilon \quad (3)$$

$$\bar{y}_{L1\_in} = \bar{y}_{emitter} = \varepsilon \quad (4)$$

Exiting lens L1:

$$y_{L1\_out} = y_{L1\_in} = \frac{d}{2} + L_0 \varepsilon \quad (5)$$

$$\bar{y}_{L1_{out}} = \bar{y}_{L1_{in}} - \frac{y_{L1_{in}}}{f_1} = \varepsilon - \frac{\frac{d}{2} + L_0 \varepsilon}{f_1} = \varepsilon\left(\frac{f_1 - L_0}{f_1}\right) - \frac{d}{2f_1} \quad (6)$$

Entering and exiting the grating (recall from the discussion above that the dashed-line chief ray does not change direction at the grating):

$$y_{grating} = y_{L1\_out} + f_1 \bar{y}_{L1\_out} = \frac{d}{2} + L_0\epsilon + \epsilon(f_1 - L_0) - \frac{d}{2} = \epsilon f_1 \quad (7)$$

$$\bar{y}_{grating} = \bar{y}_{L1\_out} = \epsilon\left(\frac{f_1 - L_0}{f_1}\right) - \frac{d}{2f_1} \quad (8)$$

To finish the calculations at the coupler, which involves propagating through the cross-coupling mitigation optics, we recall that the dashed-line chief ray intersects the coupler at its center. Therefore, only the ray slope at the coupler is non-zero, and we note that the ray height and ray slope at the grating must both be proportional to the ray slope at the coupler. This implies that the ratio of the height to the slope at the grating must be a constant. And, we can interpret that constant very intuitively as the negative of the effective distance of the coupler from the grating, as determined by the cross-coupling mitigation optics. In other words, $$\frac{y_{grating}}{\bar{y}_{grating}} \equiv -L_{cplr\_eff} \quad (9)$$

where $L_{cplr\_eff}$ is the effective distance of the coupler beyond (to the right of) the grating.

In practice, $L_{cplr\_eff}$ can be calculated either with a raytrace or with a y/y-bar analysis of the post-grating lenses. But in any case, Equation 9 allows us to solve Equations 7 and 8 for our deviation angle $\epsilon$, with the following result:

$$\epsilon = \left(\frac{d}{2f_1}\right) \bigg/ \left[\left(\frac{f_1 - L_0}{f_1}\right) + \left(\frac{f_1}{L_{cplr\_eff}}\right)\right] \quad (10)$$

Now that we have the deviation angle $\epsilon$ that results in cross-coupling, we are finally in a position to calculate the amount of cross-coupling. One reasonable definition of the cross-coupling is the integral over solid angle at the emitter of the product of the self-coupled intensity and the cross-coupled intensity, normalized by the integral of the square of the self-coupled intensity. Prior to calculating that integral, it is important to note that in the name of simplifying symmetry, it is assumed that both the outgoing and incoming beams at the cross-coupling emitters equally deviate. What we need to do for our overlap integral is to consider one beam (the self-coupled beam) to be undeviated, and the other beam (the cross-coupled beam) to be deviated by twice our angle $\epsilon$. Putting this paragraph into equation form, we have:

$$\text{overlap} = \frac{\int \exp\left[-2\left(\frac{\theta}{\theta_{1/2}}\right)^2\right] \exp\left[-2\left(\frac{\theta - 2\epsilon}{\theta_{1/2}}\right)^2\right] d\theta}{\int \exp\left[-2\left(\frac{\theta}{\theta_{1/2}}\right)^2\right] \exp\left[-2\left(\frac{\theta}{\theta_{1/2}}\right)^2\right] d\theta} \quad (11)$$

(Note that Equation 11 involves one-dimensional integrals over a single angle instead of two-dimensional integrals over solid angles. This is because the integration over angle in the direction orthogonal to the beam deviation yields a constant that drops out of the ratio in Equation 11.) Equation 11 can be simplified to yield:

$$\text{overlap} = \exp\left[-\left(\frac{2\epsilon}{\theta_{1/2}}\right)^2\right] \quad (12)$$

In summary, we calculate the relevant deviation angle $\epsilon$ in terms of known parameters according to Equation 10. We then calculate the resulting overlap according to Equation 12. This gives the ratio of cross-coupled intensity to self-coupled intensity, assuming that in the self-coupled case there is a perfect waist at the coupler.

There is a very interesting possibility for having a large impact on cross-coupling when near but not quite at the usual configuration of placing the emitters one focal length back from L1. If we precisely placed the emitters there, then the first term in the denominator of Equation 10 would be zero, and Equation 10 would reduce to:

$$\epsilon_{(L_0 = f_1)} = \frac{(d)(L_{cplr\_eff})}{2f_1^2} \quad (13)$$

Substituting equation 13 into equation 12 yields $$\text{overlap} = \exp\left[-4\left(\frac{d * (L_{cplr\_eff})}{d' * Zr}\right)^2\right]$$

Here d' is the emitter diameter at the near field, and Zr is the Rayleigh range of the beam. Thus, to reduce cross coupling the near-field fill-factor (d/d') should be high, the optical path length between the grating and coupler should be long, and the Rayleigh range should short. Typically the near-field fill-factor is fixed. As an example, if we assume the WBC consists of 20 bars and transform lens having a focal length of 2000 mm, then the beam size at the grating is roughly 40 mm (assuming 20 milli-radian full beam divergence). The Rayleigh range of such a beam (1 μm wavelength and diffraction limited) is about 160 m. The distance between the grating and output coupler should be comparable to the Rayleigh range for cross coupling mitigation. Such length would make the WBC system essentially impractical. However, if the beam is de-magnified by 40× between the grating and the output coupler the optical path length is shortened by 160× or to about 1 m. Further reduction in optical path length can be achieved using larger reduction in beam size. The beam de-magnification can be accomplished using various mechanisms such lenses, prisms, or combination of both. Careful design must be taken such that self-coupling of each emitter does not degrade such that the cavity suffers in performance.

But, if the emitters are slightly off from this position, then the first term in the denominator of Equation 10 can actually cancel the second term, making the required deviation angle infinite and the cross-coupling overlap zero. Specifically, this happens when:

$$L_0 = f_1 + \left(\frac{f_1^2}{L_{cplr\_eff}}\right) \quad (14)$$

In other words, when the effective distance to the coupler $L_{cplr\_eff}$ is very large, Equation 14 gives us a potential recipe for pulling the emitters slightly back from the front focus of L1 in order to destroy cross-coupling.

Figure 3:
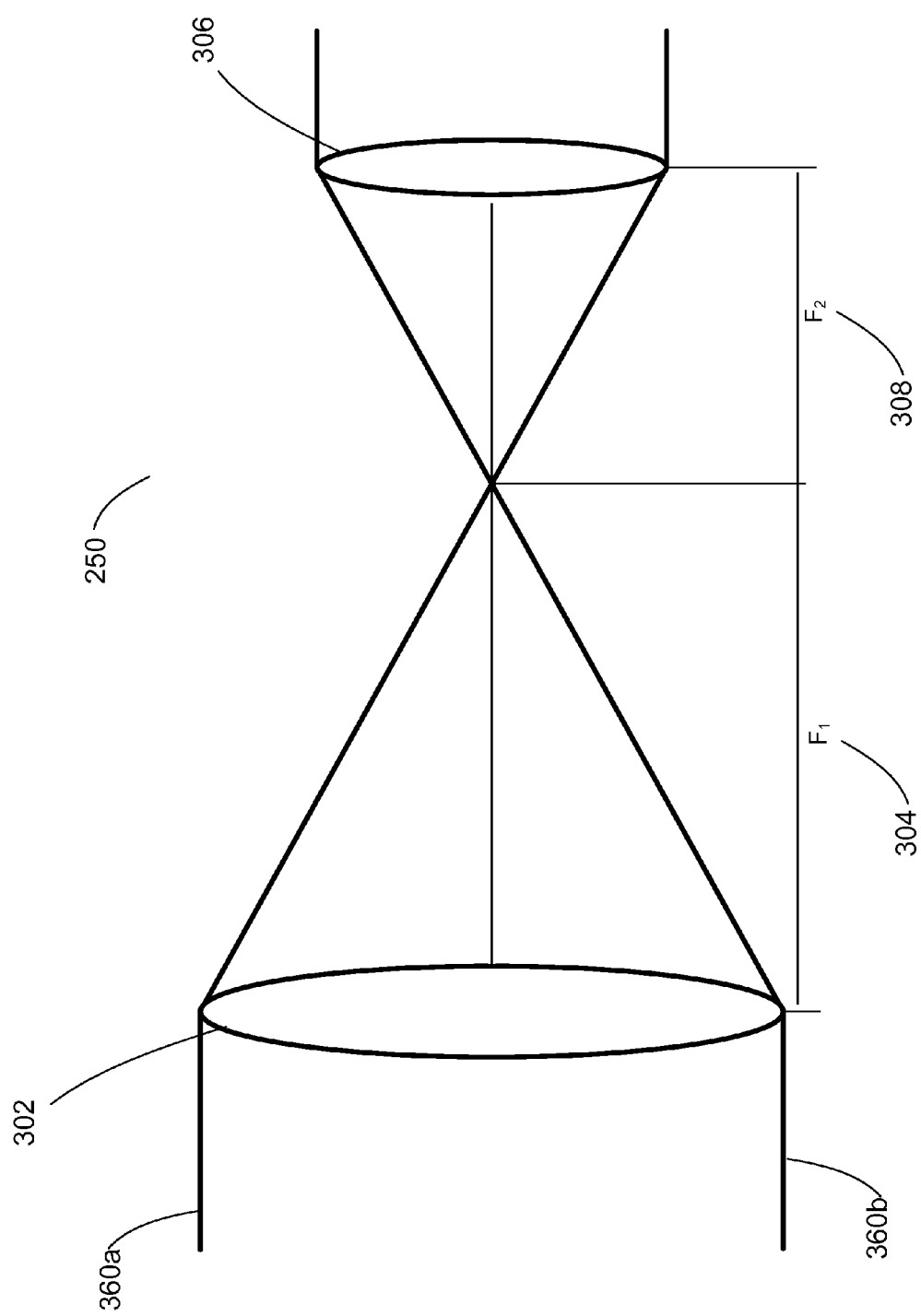
FIG. 3 illustrates one embodiment of a cross-coupling optical system.

FIG. 3 illustrates one example of a cross-coupling mitigation system 250 illustrated by a box in FIG. 2. Here, optical element 302 may be a lens having a focal length $F_1$ 304. A second optical element 306 may also be a lens and have a focal length $F_2$ 308. The distance between 302 and 306 is exactly or approximately the sum of the focal lengths $F_1$ and $F_2$. As discussed previously, it is ideal that the ratio of $F_1$ over $F_2$ ($F_1/F_2$) is at least two times or greater. The system 250, may be an afocal telescoping system. In other embodiments, multiple optical elements may be used wherein the effect of the system still maintains the properties of an afocal telescoping system having a large ratio.

It is desirable to place lens 302 within the Rayleigh range of beams being transmitted from a dispersive element (diffraction grating) while also placing a partially-reflective output coupler or other reflective surface within the Rayleigh range of beams coming out of lens 306. By appropriately placing lenses having a F1>>F2 relationship within these positions, an effective system is created to reduce and in some cases eliminate any cross-coupling feedback from entering the non-originating emitter or source.

The above description is merely illustrative. Having thus described several aspects of at least one embodiment of this invention including the preferred embodiments, it is to be appreciated that various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A wavelength beam combining laser system comprising:
   a plurality of beam emitters each emitting a beam;
   a dispersive element for receiving and dispersing the beams;
   a cross-coupling mitigation system for receiving and transmitting the dispersed beams while reducing cross-coupling thereof; and
   a partially reflecting output coupler positioned to receive the beams transmitted by the cross-coupling mitigation system, transmit a first portion thereof as a multi-wavelength output beam, and reflect a second portion thereof back toward the cross-coupling mitigation system,
   wherein the partially reflecting output coupler is disposed within a Rayleigh range of the beams transmitted by the cross-coupling mitigation system.

2. The system of claim 1, wherein the cross-coupling mitigation system is afocal.

3. The system of claim 1, wherein the cross-coupling mitigation system comprises an afocal telescope.

4. The system of claim 1, wherein the cross-coupling mitigation system comprises a first optical element having a first focal length and a second optical element having a second focal length, the first optical element being disposed optically upstream of the second optical element.

5. The system of claim 4, wherein the first focal length is at least two times greater than the second focal length.

6. The system of claim 4, wherein the first focal length is at least seven times greater than the second focal length.

7. The system of claim 4, wherein each of the first and second optical elements comprises a lens.

8. The system of claim 4, wherein the first optical element is disposed within a Rayleigh range of the dispersed beams from the dispersive element.

9. The system of claim 4, wherein the partially reflecting output coupler is disposed within a Rayleigh range of the beams transmitted by the second optical element.

10. The system of claim 4, wherein an optical distance between the first and second optical elements is approximately equal to a sum of the first and second focal lengths.

11. The system of claim 1, further comprising focusing optics for receiving the beams emitted by the beam emitters and focusing the beams toward the dispersive element.

12. The system of claim 11, wherein an optical distance between the plurality of beam emitters and the focusing optics is approximately equal to a focal length of the focusing optics.

13. The system of claim 11, wherein an optical distance between the plurality of beam emitters and the focusing optics is greater than a focal length of the focusing optics.

14. The system of claim 1, wherein the dispersive element comprises a diffraction grating.

* * * * *